US008860953B2

(12) United States Patent
Shim et al.

(10) Patent No.: US 8,860,953 B2
(45) Date of Patent: Oct. 14, 2014

(54) METHOD AND APPARATUS FOR MEASURING OVERLAY

(75) Inventors: Seong-Bo Shim, Suwon-si (KR); Jeong-Ho Yeo, Suwon-si (KR); Ho-Yeon Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 457 days.

(21) Appl. No.: 13/349,770

(22) Filed: Jan. 13, 2012

(65) Prior Publication Data

US 2012/0188543 A1  Jul. 26, 2012

(30) Foreign Application Priority Data

Jan. 25, 2011 (KR) ........................ 10-2011-0007303

(51) Int. Cl.
*G01B 11/00* (2006.01)
*G01B 11/14* (2006.01)
*G03F 7/20* (2006.01)

(52) U.S. Cl.
CPC ................................ *G03F 7/70633* (2013.01)
USPC ............................ 356/614; 356/616; 356/399

(58) Field of Classification Search
USPC ..................... 356/237.1–241.6, 242.1–243.8, 356/426–431, 600–640
See application file for complete search history.

(56) References Cited

U.S. PATENT DOCUMENTS

| 5,389,927 | A | * | 2/1995 | Turney et al. ................. 341/139 |
| 7,112,813 | B2 | | 9/2006 | Den Boef et al. |
| 7,486,386 | B1 | * | 2/2009 | Holcombe et al. ........... 356/4.01 |
| 7,728,316 | B2 | * | 6/2010 | Fadell et al. ............. 250/559.38 |
| 2007/0099574 | A1 | * | 5/2007 | Wang ......................... 455/67.11 |
| 2008/0135735 | A1 | * | 6/2008 | Gottesman et al. ....... 250/214 A |
| 2008/0158184 | A1 | * | 7/2008 | Land et al. ..................... 345/173 |
| 2010/0245289 | A1 | * | 9/2010 | Svajda ......................... 345/175 |

FOREIGN PATENT DOCUMENTS

| JP | 11-288865 A | 10/1999 |
| KR | 10-2001-0081248 A | 8/2001 |
| KR | 10-2001-0107299 A | 12/2001 |

* cited by examiner

*Primary Examiner* — Tarifur Chowdhury
*Assistant Examiner* — Jarreas C Underwood
(74) *Attorney, Agent, or Firm* — Lee & Morse P.C.

(57) ABSTRACT

A method of measuring an overlay includes generating an original signal using first and second overlay measurement keys that are spaced apart from each other, generating a first spectrum signal by performing Fourier transform of the original signal, generating a second spectrum signal by filtering the first spectrum signal, and generating a corrected signal by performing inverse Fourier transform of the second spectrum signal.

17 Claims, 9 Drawing Sheets

METHOD AND APPARATUS FOR MEASURING OVERLAY

CROSS-REFERENCE TO RELATED APPLICATIONS

Korean Patent Application No. 10-2011-0007303, filed on Jan. 25, 2011, in the Korean Intellectual Property Office, and entitled: "Method and Apparatus for Measuring Overlay," is incorporated by reference herein in its entirety.

BACKGROUND

1. Field of the Inventive Concept

Embodiments relate to a method and apparatus for measuring an overlay.

2. Description of the Prior Art

With the rapid spread of information mediums such as a computer, semiconductor devices have made rapid progress. Semiconductor device are serve to enable a device at high speed but also to provide a large-scale storage capacity. To answer such requirements, a technique of fabricating a semiconductor device has been developed in the direction of improving the integrity, reliability, and response speed of the semiconductor device.

Accordingly, as a scheme for increasing the competitiveness in the semiconductor industry, unit processes that can secure high product yield have been developed, and a method and apparatus for measuring process errors in the respective unit processes have been actively researched. Particularly, in the case of a photolithography process, which is one of the core elements of a semiconductor fabricating processes, the change of process conditions is frequent. Thus, process development for coping with changes in processing conditions and an apparatus for performing the same are necessary.

In the photolithography process, misalignment of a photoresist pattern that is formed by exposing and developing the photoresist should be considered. Misalignment is caused by a reduction of an alignment margin due to high integration of a semiconductor device, large diameter of a wafer, and increase in the photolithography process. Thus, it becomes more difficult to achieve an accurate align. In order to prevent misalignment, it is essentially required to optimize the overlay measurement that is a task for confirming the alignment of the photoresist pattern that is formed on a wafer.

An IBO (Image Based Overlay) measurement method measures the overlay by detecting the center coordinates of a vernier and the center coordinates of a main beam and measuring the relative difference between two coordinates. The image based overlay measurement method meets with several technical limitations as design rules become smaller.

On the other hand, a DBO (Diffraction Based Overlay) measurement method uses a main beam and a vernier which have some offsets as measurement keys. Since the vernier is arranged on the main beam, the main beam and the vernier overlap each other in space. Particularly, since the vernier is arranged on the main beam, the state of the main beam exerts an influence on the state of the vernier. For example, if the step height of the main beam is great, coating inferiority or undercut may occur when the vernier is formed. Further, the pattern of the vernier may be destroyed. In this case, the accuracy of the DBO measurement method is lowered.

SUMMARY

One or more embodiments provide a method of measuring an overlay that can more stably measure overlay as compared to conventional methods.

One or more embodiments provide an apparatus for measuring an overlay that can more stably measure overlay as compared to conventional devices.

One or more embodiments provide a method of measuring an overlay, including generating an original signal using first and second overlay measurement keys which are spaced apart from each other, generating a first spectrum signal by performing Fourier transform of the original signal, generating a second spectrum signal by filtering the first spectrum signal, and generating a corrected signal by performing inverse Fourier transform of the second spectrum signal.

The original signal may be a signal that is changed according to a first variable and a second variable, and the corrected signal may be a signal that is independent of the first variable.

The first and second overlay measurement keys may include a grating shape having a length extending in a first direction, the first and second overlay measurement keys are arranged to be spaced apart from each other in the first direction, and an image of the corrected signal includes a first grating shape and a second grating shape that overlap each other.

Performing the Fourier transform of the original signal may include making the original signal pass through a Fourier transform lens set.

The first spectrum signal may be formed in a spectrum domain that includes a first axis and a second axis, which has an optical axis of the Fourier transform lens set as an original point, the first spectrum signal may include a plurality of dot signals, and a pitch of the first spectrum signal in a second-axis direction may be wider than a pitch in a first-axis direction.

Filtering the first spectrum signal may include removing a remainder of the first spectrum signal except for the dot signals arranged on the second axis.

Filtering the first spectrum signal may include making the first spectrum signal pass through a filter in a slit shape.

Filtering the first spectrum signal may include operating the first spectrum signal and a delta function.

Performing inverse Fourier transform of the second spectrum signal may include making the second spectrum signal pass through a restoration lens set.

The second overlay measurement key may be formed at a higher level than the first overlay measurement key.

The first and second overlay measurement keys may include a grating shape having a length extending in a first direction, and a distance between the first and second overlay measurement keys may be shorter than an optical width of light that illuminates the first and second overlay measurement keys.

The first overlay measurement key may be arranged to be shifted from the second overlay measurement key in a second direction that is different from the first direction.

One or more embodiments provide an apparatus for measuring an overlay, including a stage on which a wafer that includes first and second overlay measurement keys that are spaced apart from each other is arranged, an original signal generation unit configured to generate an original signal using the first and second overlay measurement keys, a Fourier transform lens set configured to generate a first spectrum signal by performing Fourier transform of the original signal, and a signal analysis unit configured to generate a second spectrum signal by filtering the first spectrum signal and generating a corrected signal by performing inverse Fourier transform of the second spectrum signal.

The original signal may be a signal that is changed according to a first variable and a second variable, and the corrected signal may be a signal that is independent of the first variable.

The first and second overlay measurement keys may include a grating shape having a length extending in a first direction, the first and second overlay measurement keys are arranged to be spaced apart from each other in the first direction, and an image of the corrected signal may include a first grating shape and a second grating shape that overlap each other.

The second overlay measurement key may be formed at a higher level than the first overlay measurement key, and the first overlay may be arranged to be shifted from the second overlay measurement key in a second direction that is different from the first direction.

The signal analysis unit may include a slit-shaped filter configured to generate the second spectrum signal by filtering the first spectrum signal, and a restoration lens set configured to generate the corrected signal by performing the inverse Fourier transform of the second spectrum signal.

The signal analysis unit may include a storage unit configured to sense and store the first spectrum signal, a first operation unit configured to generate a second spectrum signal by operating the first spectrum signal and a delta function, and a second operation unit configured to generate the corrected signal by performing the inverse Fourier transform of the second spectrum signal.

The first spectrum signal may be formed in a spectrum domain that includes a first axis and a second axis, which has an optical axis of the Fourier transform lens set as an original point, the first spectrum signal includes a plurality of dot signals, and a pitch of the first spectrum signal in a second-axis direction may be wider than a pitch in a first-axis direction.

Filtering the first spectrum signal may include removing a remainder of the first spectrum signal except for the dot signals arranged on the second axis.

One or more embodiments provide a method of measuring an overlay, including illuminating first and second overlay measurement keys to generate an original signal based on the first and second overlay measurement keys, the first and second overlay measurement keys each including a plurality of bars having a length and a width, generating a first spectrum signal by performing Fourier transform of the original signal, a pitch of the first spectrum signal corresponding to the widths and the lengths of the first and second overlay measurement keys, generating a second spectrum signal by filtering the first spectrum signal, and generating a corrected signal by performing inverse Fourier transform of the second spectrum signal, wherein a distance between the first and second overlay measurement keys along a first direction is shorter than an optical width of the light that illuminates the first and second overlay measurement keys.

BRIEF DESCRIPTION OF THE DRAWINGS

The above features will become more apparent to those of ordinary skill in the art by describing in detail exemplary embodiments with reference to the attached drawings, in which.

DETAILED DESCRIPTION

Figure 1:
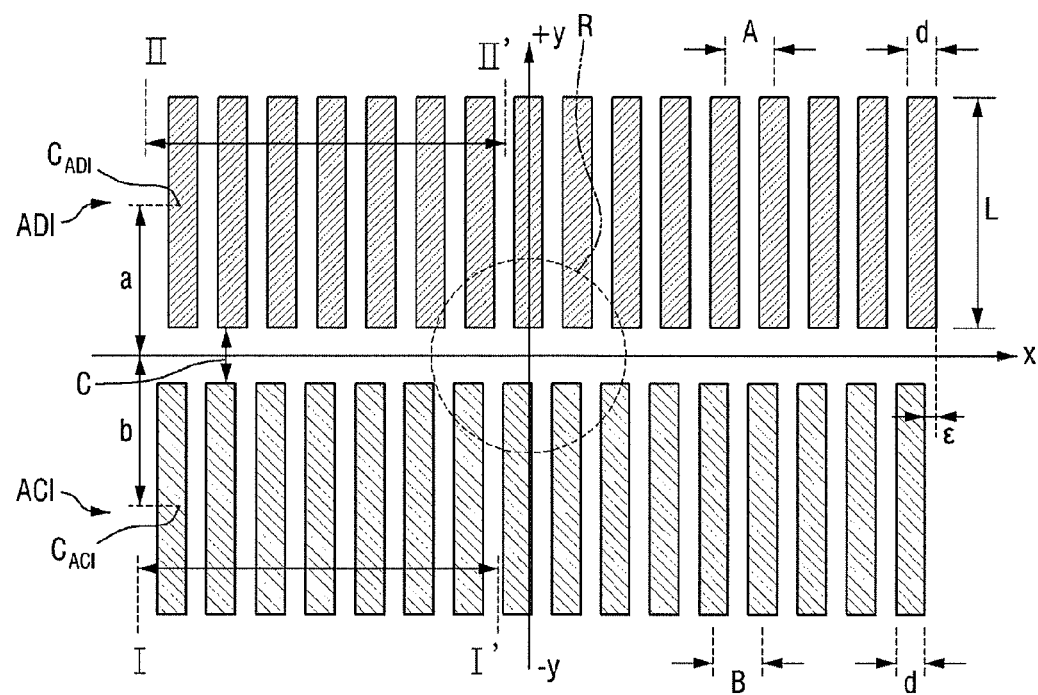
FIG. 1 illustrates an exemplary plan view of an overlay measurement key employable in an exemplary embodiment of a method of measuring an overlay.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, these elements should not be limited by these terms. These terms are only used to distinguish one element from another element. Thus, a first element could be termed a second element without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to the accompanying drawings.

Figure 2:
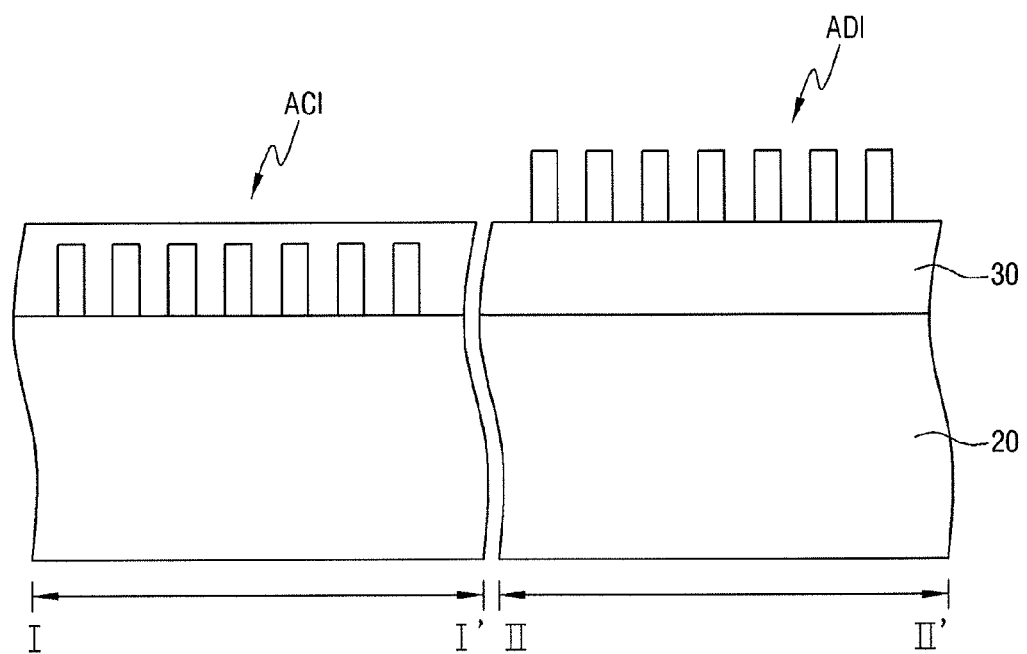
FIG. 2 illustrates a cross-sectional view taken along lines I-I' and II-II' of FIG. 1.

FIG. 1 illustrates an exemplary plan view of an overlay measurement key employable in an exemplary embodiment of a method of measuring an overlay. FIG. 2 illustrates a cross-sectional view taken along lines I-I' and II-II' of FIG. 1.

Referring to FIGS. 1, and 2, first and second overlay measurement keys ACI and ADI may be formed in a scribe line area of a wafer 20. Here, the first and second overlay measurement keys ACI and ADI may be separated from each other and may be arranged to be spaced apart from each other (that is, may not overlap each other).

Further, as illustrated in the exemplary embodiment of FIG. 1, the first and second overlay measurement keys ACI and ADI may each include a grating shape and one or more bars of the gratings may extend along a first direction (e.g., y-axis direction of FIG. 1). In FIG. 1, for convenience in explanation, the first and second overlay measurement keys ACI and ADI are illustrated in a domain that includes a first axis (for example, y axis) and a second axis (for example, x axis).

Specifically, the first overlay ACI may include a plurality of bars having a length extending along the first direction (e.g., y-axis direction). Referring to FIG. 1, the length of each bar may be L, a width of each bar may be d, and a pitch between neighboring bars may be B.

Further, the second overlay ADI may include a plurality of bars having a length extending in the first direction (e.g., y-axis direction). Referring to FIG. 1, the length of each bar may be L', a width of each bar may be d', and a pitch between neighboring bars may be A. In one or more embodiments, L may equal L', d may equal d', and/or B may equal A.

Further, the first overlay measurement key ACI and the second overlay measurement key ADI may be spaced apart from each other in the first direction (e.g., y-axis direction). More specifically, e.g., a center $C_{ADI}$ of the second overlay measurement key ADI may be at a distance a in the +y direction from the x axis, and a center $C_{ACI}$ of the first overlay measurement key ACI may be at a distance b in the −y direction from the x axis. A distance c between the first overlay measurement key ACI and the second overlay measurement key ADI may be shorter than a light width R of illumination light. Thus, as illustrated in FIG. 1, the first overlay measurement key ACI and the second overlay measurement key ADI may receive light simultaneously.

Further, the first overlay measurement key ACI may be arranged to be shifted as much as E from the second overlay measurement key ADI in the second direction (e.g., x-axis direction) that is different from the first direction (e.g., y direction).

Further, one of the first and second overlay measurement keys ACI, ADI (e.g., ACI) may be a main beam, and the other thereof (e.g., ADI) may be a vernier. That is, the first overlay measurement key ACI may be made first, and the second overlay measurement key ADI may be made thereafter. More particularly, e.g., the second overlay measurement key ADI may be positioned at a relatively higher level than the first overlay measurement key ACI relative to a substrate 20. An insulating layer 30 may be below the second overlay measurement key ADI. The insulating layer 30 may be between the first overlay measurement key ACI and the second overlay measurement key ADI.

Figure 3:
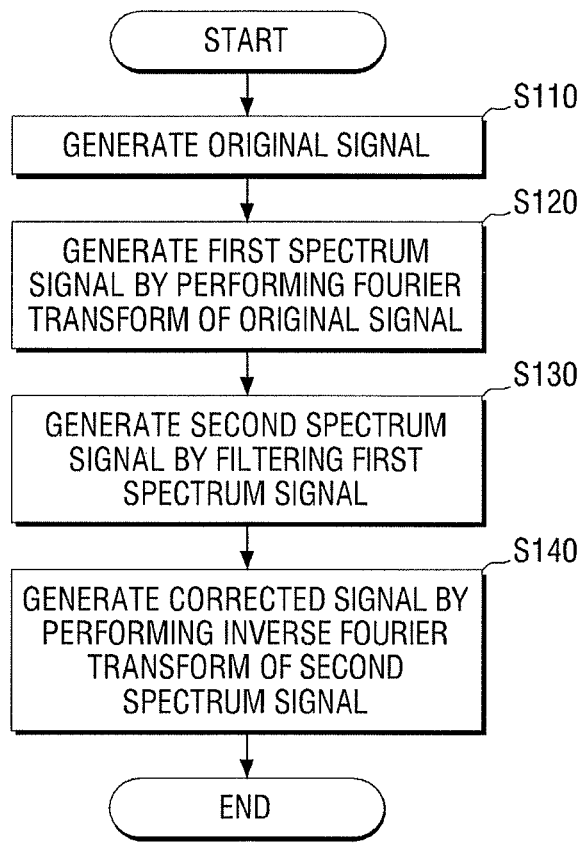
FIG. 3 illustrates a flowchart of an exemplary embodiment of a method of measuring an overlay.

Hereinafter, referring to FIGS. 3 to 7, exemplary methods of measuring an overlay will be described. FIG. 3 illustrates a flowchart of an exemplary embodiment of a method of measuring an overlay. FIGS. 4 to 7 illustrate plan views of a first spectrum signal, a filter, a second spectrum signal, and a correction signal, respectively.

First, referring to FIG. 3, an original signal K(x,y) may be generated using the first and second overlay measurement keys, e.g., ACI, ADI, which are spaced apart from each other (S110).

The original signal K(x,y) may be a signal that is refracted and generated by the first and second overlay measurement keys ACI, ADI onto which light is irradiated. The original signal K(x,y) may be expressed by Equation (1) below. Here, "rect" corresponds to a rectangular function, and "comb" corresponds to a Dirac comb function. Further, characters a, b, d, L, A, and B are as described above using FIG. 1. The original signal K(x,y) may be a signal that is changed according to a first variable (e.g., y) and a second variable (e.g., x).

$$K(x, y) = rect\left(\frac{y-a}{L}\right)\left[comb\left(\frac{x}{A}\right) \otimes rect\left(\frac{x}{d}\right)\right] + \quad (1)$$
$$rect\left(\frac{y+b}{L}\right)\left[comb\left(\frac{x-\varepsilon}{B}\right) \otimes rect\left(\frac{x}{d}\right)\right]$$

Figure 4:
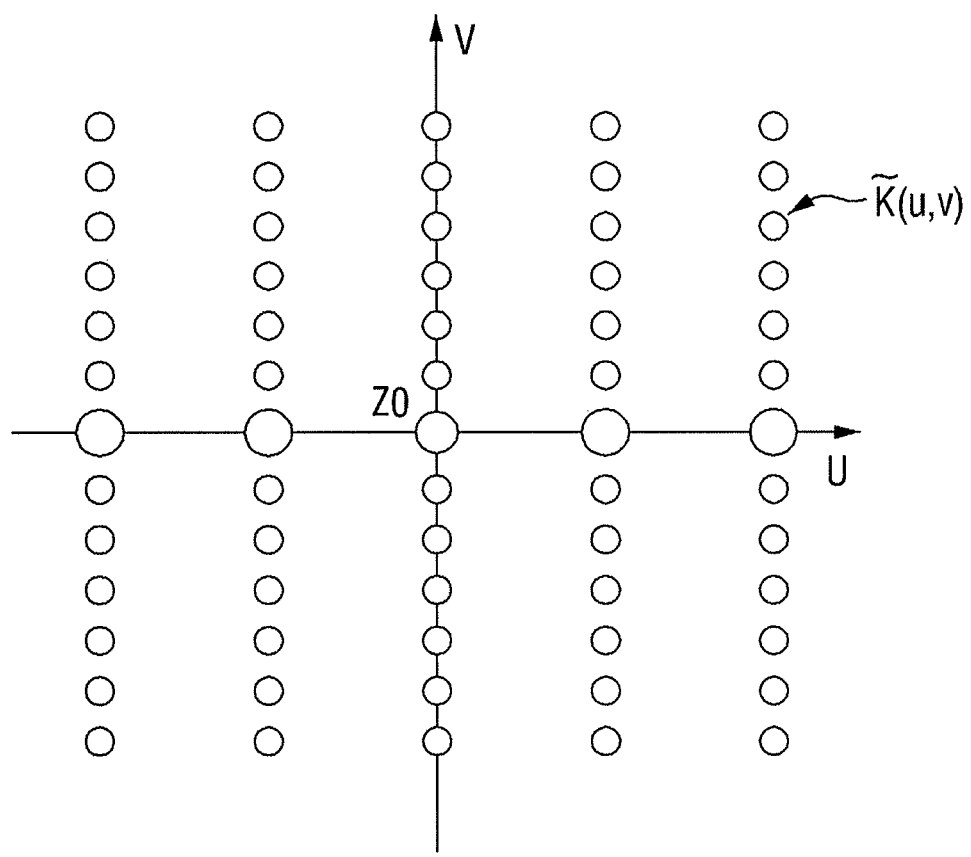
FIGS. 4 to 7 illustrate plan views of a first spectrum signal, a filter, a second spectrum signal, and a correction signal, respectively.

Referring to FIGS. 3 and 4, a first spectrum signal $\tilde{K}(u, v)$ may be generated by performing Fourier transform of the original signal K(x,y) (S120). The first spectrum signal $\tilde{K}(u, v)$ may be expressed by Equation (2). Performing the Fourier transform of the original signal K(x,y) may correspond to making the original signal K(x,y) pass through a Fourier transform lens set.

$$\tilde{K}(u, v) = \tilde{F}[K(x, y)] \quad (2)$$
$$= \alpha \mathrm{sinc}(Lv)\exp(-jav) \otimes \{comb(Au)\mathrm{sinc}(du)\} +$$
$$\beta \mathrm{sinc}(Lv)\exp(jbv) \otimes \{comb(Bu)\mathrm{sinc}(du)\}\exp(-j\varepsilon u)$$

The first spectrum signal $\tilde{K}(u,v)$ may be formed in a spectrum domain (or pupil domain) that includes a third axis (e.g., v) and a fourth axis (e.g., u). The original point z0 at which the third axis and the fourth axis cross each other may be an optical axis of the Fourier transform lens set.

The first spectrum signal $\tilde{K}(u, v)$ may include a plurality of dot signals as illustrated in FIG. 4. In one or more embodiments, a pitch of the first spectrum signal $\tilde{K}(u, v)$ in the fourth-axis direction may be wider than a pitch in the third-axis direction. The pitch of the first spectrum signal $\tilde{K}(u, v)$ may reflect a shape of the first and second overlay measurement keys ACI and ADI. More particularly, e.g., in the exemplary embodiment of FIGS. 1 and 2, since the pitch (e.g., B in FIG. 1) of the first overlay measurement key ACI and the pitch (e.g., A in FIG. 1) of the second overlay measurement key ADI are relatively narrow, a pitch of the first spectrum signal $\tilde{K}(u, v)$ in the fourth-axis direction is wide. By contrast, since the distance between the first overlay measurement key ACI and the second overlay measurement key ADI c is relatively large, a pitch of the first spectrum signal $\tilde{K}(u, v)$ in the third-axis direction is narrow.

Figure 5:
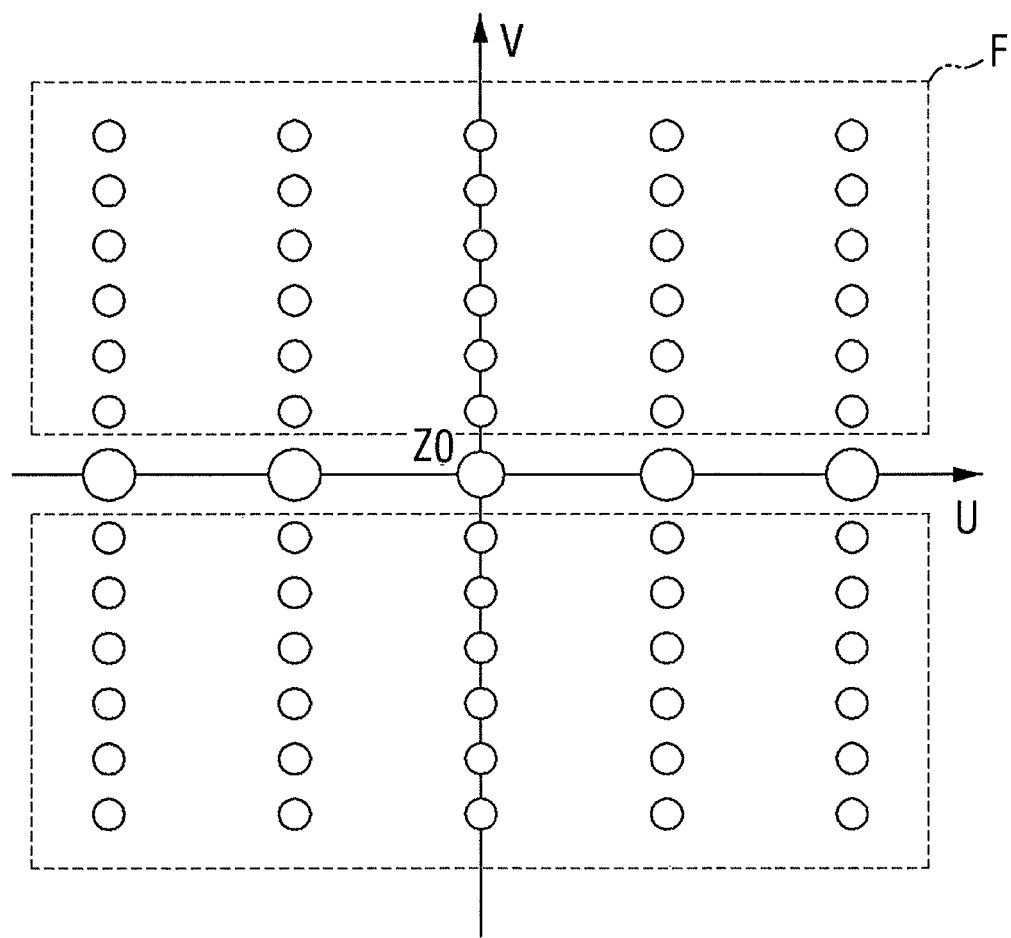
Figure 6:
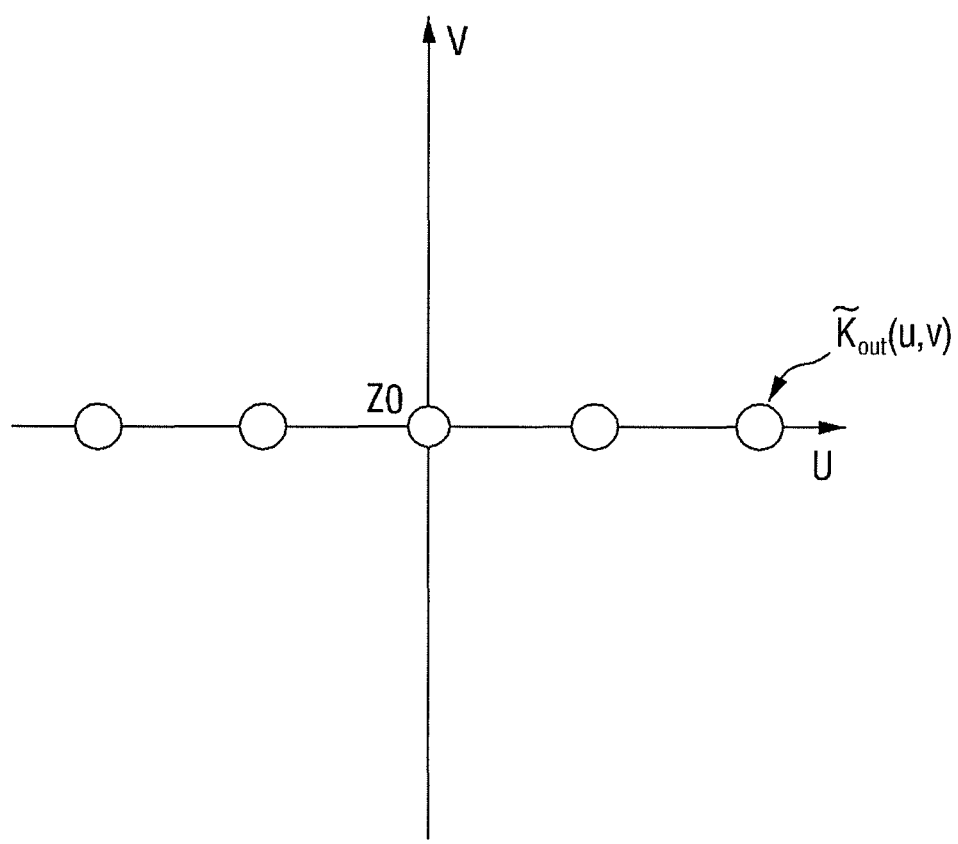

Referring to FIGS. 3, 5, and 6, a second spectrum signal $\tilde{K}_{out}(u, v)$ may be generated by filtering the first spectrum signal $\tilde{K}(u, v)$ (S130).

Specifically, filtering of the first spectrum signal $\tilde{K}(u, v)$ may remove a remainder except for dot signals arranged on the fourth axis. That is, by making the first spectrum signal $\tilde{K}(u, v)$ pass through a filter F as illustrated in FIG. 5, the second spectrum signal $\tilde{K}_{out}(u, v)$ may be obtained.

As a result of filtering, the second spectrum signal $\tilde{K}_{out}(u, v)$ may be expressed as in Equation (3).

$$\tilde{K}_{out}(u, v) = \tilde{K}(u, v) \times \mathrm{Filter} \quad (3)$$
$$= \tilde{K}(u, v) \times \delta(v - 0)$$
$$= \alpha comb(Au)\mathrm{sinc}(du) + \beta comb(Bu)\mathrm{sinc}(du)\exp(-j\varepsilon u)$$

Diverse methods may be used in filtering the first spectrum signal $\tilde{K}(u, v)$. For example, in a physical-type method, the second spectrum signal $\tilde{K}_{out}(u, v)$ may be generated by making the first spectrum signal $\tilde{K}(u, v)$ pass through the filter F in a slit shape, as illustrated in FIG. 5. On the other hand, in an image-processing-type method, the second spectrum signal $\tilde{K}_{out}(u, v)$ may be generated by operating the first spectrum signal $\tilde{K}(u, v)$ and a delta function.

Figure 7:
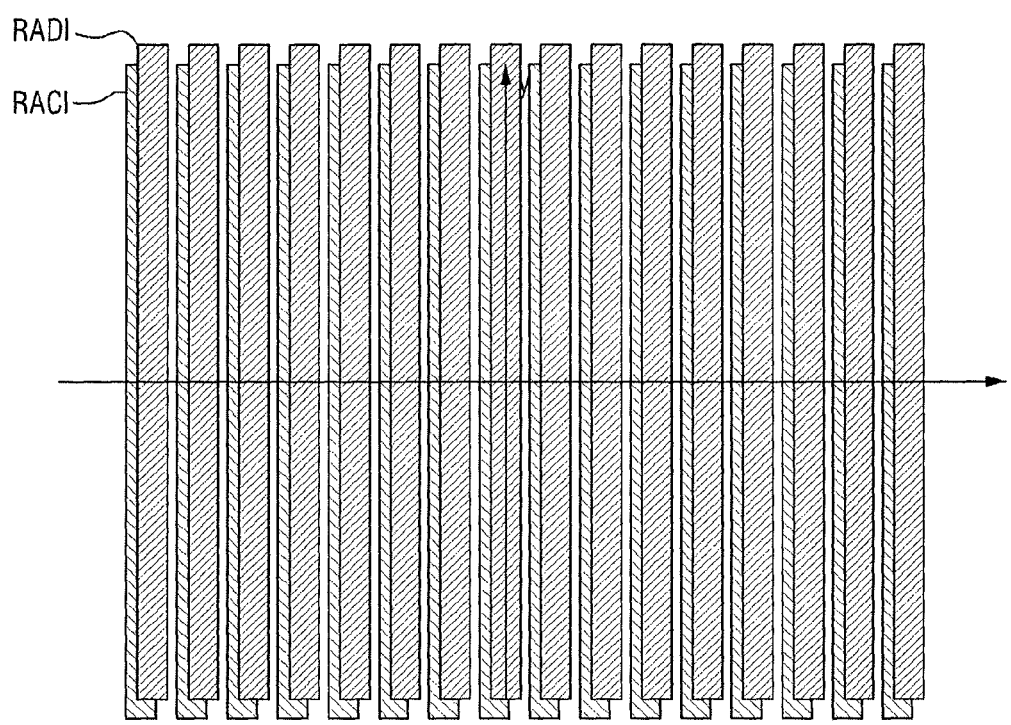

Referring to FIGS. 3 and 7, a corrected signal $\tilde{K}_{out}(x,y)$ may be generated by performing inverse Fourier transform of the second spectrum signal $\tilde{K}_{out}(u, v)$ (S140). The corrected signal $K_{out}(x,y)$ may be expressed by Equation (4). Performing the inverse Fourier transform of the second spectrum signal $\tilde{K}_{out}(u, v)$ may correspond to making the second spectrum signal $\tilde{K}_{out}(u, v)$ pass through a restoration lens set.

$$K_{out}(x, y) = \alpha' \left[ comb\left(\frac{x}{A}\right) \otimes rect\left(\frac{x}{d}\right) \right] + \beta' \left[ comb\left(\frac{x-\varepsilon}{B}\right) \otimes rect\left(\frac{x}{d}\right) \right] \quad (4)$$

Here, although the original signal $K(x,y)$ may be signal that is changed according to the first variable (e.g., y) and the second variable signal (e.g., x), the corrected signal $K_{out}(x,y)$ may be irrelevant to the first variable (y). That is, referring to Equation (4), the corrected signal $K_{out}(x,y)$ may not include a term that is relevant to the first variable (y).

An image of the corrected signal $K_{out}(x,y)$ may be a signal in the form as shown in FIG. 7. The image of the corrected signal $K_{out}(x,y)$ may include a first grating shape RACI and a second grating shape RADI that at least partially overlap each other. The first overlay measurement key ACI may be arranged only on the lower side of the first axis (e.g., y axis), and the second overlay measurement key ADI may be arranged only on the upper side of the first axis. However, as shown in the exemplary embodiment of FIG. 7, the first grating shape RACI and the second grating shape RADI may become longer than the first overlay measurement key ACI and the second overlay measurement key ADI, and may be positioned on the upper side and the lower side of the first axis. The reason why the image of the corrected signal $K_{out}(x,y)$ has the shape as illustrated in FIG. 7 is that the corrected signal $K_{out}(x,y)$ does not include the term that is relevant to the first variable (y).

Accordingly, based on the first grating shape RACI and the second grating shape RADI which overlap each other, positions of the first overlay measurement key ACI and the second overlay measurement key ADI can be investigated. Accordingly, the state of the first overlay measurement key ACI does not exert an influence on the state of the second overlay measurement key ADI. That is, a step height of the first overlay measurement key may be great, and thus, coating inferiority or undercut does not occur and/or may be minimized when the second overlay measurement key is formed.

Further, in one or more methods of measuring the overlay, although the first overlay measurement key ACI and the second overlay measurement key ADI are spaced apart from each other, it is possible to make the first grating shape RACI and the second grating shape RADI overlap each other through the use of a physical filer or image processing filtering. Accordingly, accurate DBO (Diffraction Based Overlay) measurement becomes possible.

Figure 8:
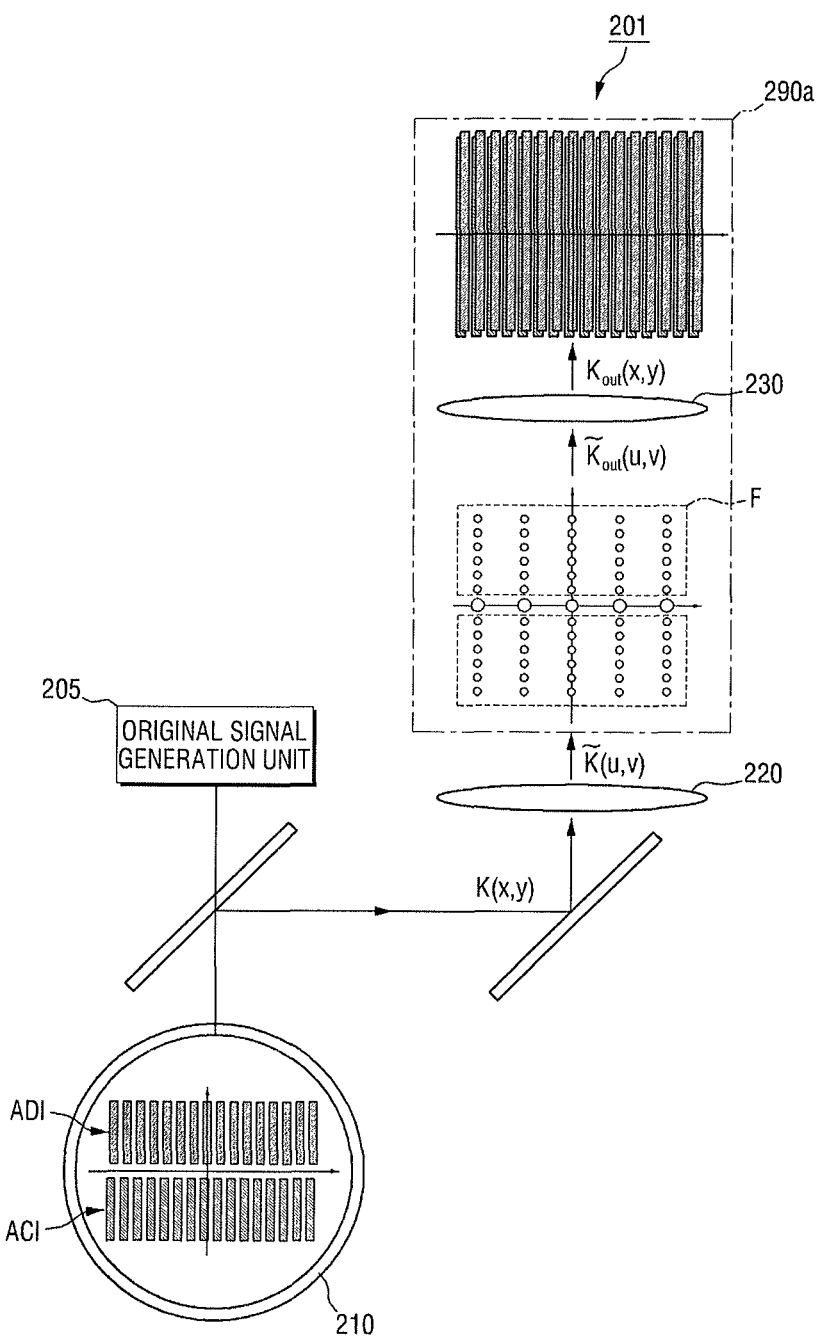
FIG. 8 illustrates a conceptual diagram of an exemplary embodiment of an apparatus for measuring an overlay.

FIG. 8 illustrates a conceptual diagram of an exemplary embodiment of an apparatus 201 for measuring an overlay; and Referring to FIG. 8, in one or more embodiments, the apparatus 201 for measuring an overlay may include a stage 210, an original signal generation unit 205, a Fourier transform lens set 220, and a signal analysis unit 290a.

On the stage 210, a wafer that includes the first and second overlay measurement keys ACI and ADI that are spaced apart from each other may be arranged.

The original signal generation unit 205 may generate the original signal $K(x,y)$ using the first and second overlay measurement keys ACI, ADI. Specifically, the original signal generation unit 205 may irradiate the first and second overlay measurement keys ACI and ADI with a source light. The source light may be a monochromatic light. The light that is generated through refraction of the source light by the first and second overlay measurement keys ACI and ADI may be the original signal $K(x,y)$.

The Fourier transform lest set 220 may generate the first spectrum signal $\tilde{K}(u, v)$ by performing Fourier transform of the original signal $K(x,y)$. As described above, the first spectrum signal $\tilde{K}(u, v)$ may be formed in the spectrum domain that includes the fourth axis (e.g., u axis) and the third axis (e.g., v axis), which has the optical axis of the Fourier transform lens set 220 as the original point. The first spectrum signal $\tilde{K}(u, v)$ may include a plurality of dot signals, and a pitch of the first spectrum signal $\tilde{K}(u, v)$ in the fourth-axis (e.g., u-axis) direction may be wider than the pitch in the third-axis (e.g., v-axis) direction.

The signal analysis unit 290a may generate the second spectrum signal $\tilde{K}_{out}(u, v)$ by filtering the first spectrum signal $\tilde{K}(u, v)$, and may generate the corrected signal $K_{out}(x,y)$ by performing inverse Fourier transform of the second spectrum signal $\tilde{K}_{out}(u, v)$. The signal analysis unit 290a may determine the positions of the first and second overlay measurement keys ACI, ADI by analyzing the corrected signal $K_{out}(x,y)$.

The signal analysis unit 290a may include a filter F in the slit shape that may generate the second spectrum signal $\tilde{K}(u, v)$ by filtering the first spectrum signal $\tilde{K}(u, v)$, and a restoration lens set 230 that may generate the corrected signal $K_{out}(x,y)$ by performing inverse Fourier transform of the second spectrum signal $\tilde{K}_{out}(u, v)$. As described above, the filter F may remove the remainder of the first spectrum signal except for the dot signals arranged on the fourth axis (that is, u axis).

Figure 9:
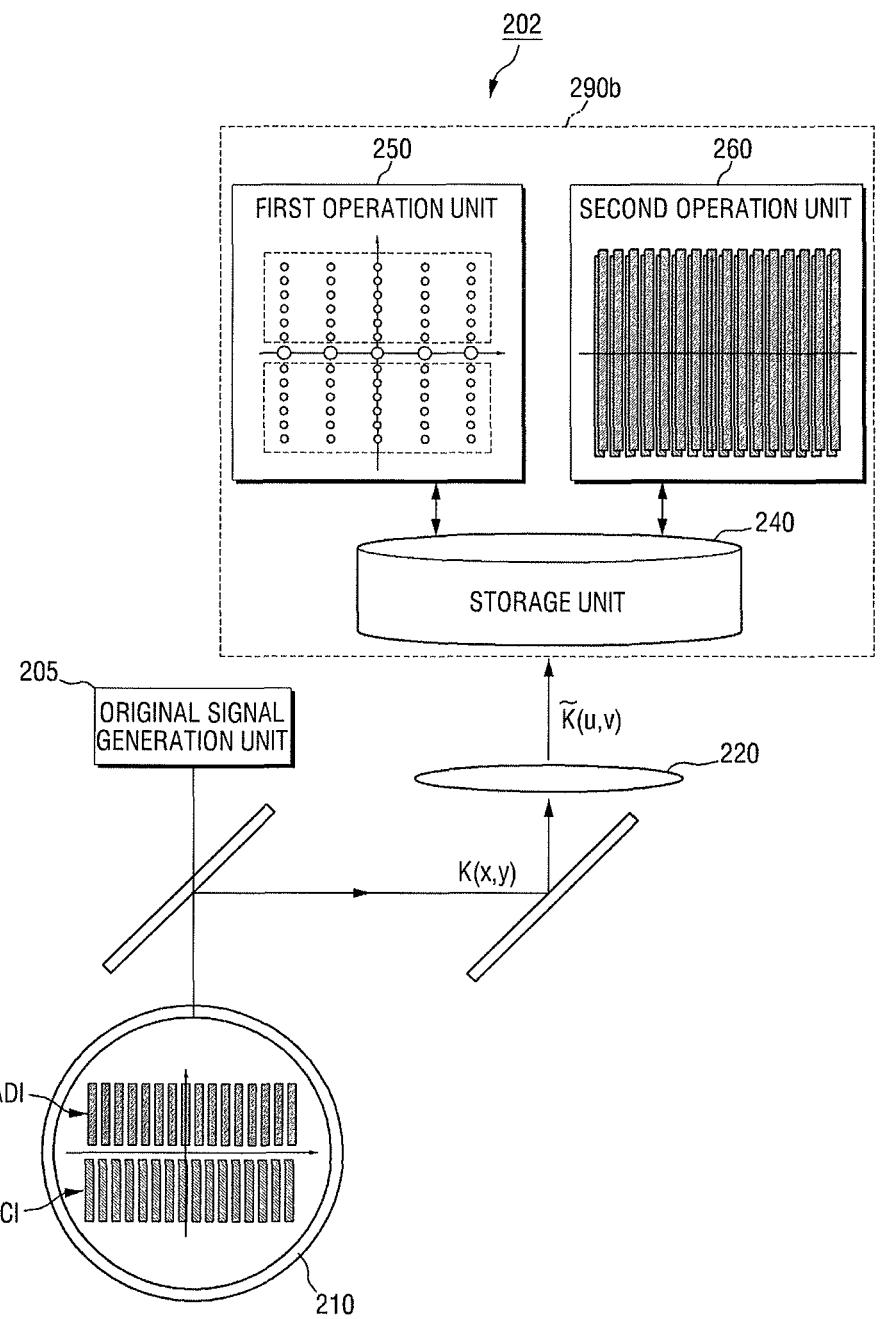
FIG. 9 illustrates a conceptual diagram of an exemplary embodiment of an apparatus for measuring an overlay.

FIG. 9 illustrates a conceptual diagram of an exemplary embodiment of an apparatus 202 for measuring an overlay.

Referring to FIG. 9, in the apparatus 202 for measuring the overlay, a signal analysis unit 290b may generate the second spectrum signal $\tilde{K}_{out}(u, v)$ in the image processing method.

The signal analysis unit 290b may generate the second spectrum signal $\tilde{K}_{out}(u, v)$ by filtering the first spectrum signal $\tilde{K}(u, v)$, and may generate the corrected signal $K_{out}(x,y)$ by performing inverse Fourier transform of the second spectrum signal $\tilde{K}_{out}(u, v)$.

The signal analysis unit 290b may include a storage unit 240 for sensing and storing the first spectrum signal $\tilde{K}(u, v)$, a first operation unit 250 generating the second spectrum signal $\tilde{K}_{out}(u, v)$ by operating the first spectrum signal $\tilde{K}(u, v)$ and the delta function, and a second operation unit 260 generating the corrected signal $K_{out}(x,y)$ by performing inverse Fourier transform of the second spectrum signal $\tilde{K}_{out}(u, v)$.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of measuring an overlay, comprising:
generating an original signal using first and second overlay measurement keys which are spaced apart from each other;
generating a first spectrum signal by performing Fourier transform of the original signal;
generating a second spectrum signal by filtering the first spectrum signal; and
generating a corrected signal by performing inverse Fourier transform of the second spectrum signal;
wherein performing the Fourier transform of the original signal includes making the original signal pass through a Fourier transform lens set; and
wherein the first spectrum signal is formed in a spectrum domain that includes a first axis and a second axis, which has an optical axis of the Fourier transform lens set as an original point, the first spectrum signal includes a plurality of dot signals, and a pitch of the first spectrum signal in a second-axis direction is wider than a pitch in a first-axis direction.

2. The method as claimed in claim 1, wherein the original signal is a signal that is changed according to a first variable and a second variable, and the corrected signal is a signal that is independent of the first variable.

3. The method as claimed in claim 1, wherein the first and second overlay measurement keys include a grating shape having a length extending in a first direction, the first and second overlay measurement keys are arranged to be spaced apart from each other in the first direction, and an image of the corrected signal includes a first grating shape and a second grating shape that overlap each other.

4. The method as claimed in claim 1, wherein filtering the first spectrum signal includes removing a remainder of the first spectrum signal except for the dot signals arranged on the second axis.

5. The method as claimed in claim 1, wherein filtering the first spectrum signal includes making the first spectrum signal pass through a filter in a slit shape.

6. The method as claimed in claim 1, wherein filtering the first spectrum signal is operating the first spectrum signal and a delta function.

7. The method as claimed in claim 1, wherein performing inverse Fourier transform of the second spectrum signal includes making the second spectrum signal pass through a restoration lens set.

8. The method as claimed in claim 1, wherein the second overlay measurement key is formed at a higher level than the first overlay measurement key.

9. The method as claimed in claim 8, wherein the first and second overlay measurement keys include a grating shape having a length extending in a first direction, and a distance between the first and second overlay measurement keys is shorter than an optical width of light that illuminates the first and second overlay measurement keys.

10. The method as claimed in claim 8, wherein the first overlay measurement key is arranged to be shifted from the second overlay measurement key in a second direction that is different from the first direction.

11. An apparatus for measuring an overlay, comprising:
a stage on which a wafer that includes first and second overlay measurement keys that are spaced apart from each other is arranged;
an original signal generation unit configured to generate an original signal using the first and second overlay measurement keys;
a Fourier transform lens set configured to generate a first spectrum signal by performing Fourier transform of the original signal; and
a signal analysis unit configured to generate a second spectrum signal by filtering the first spectrum signal and generating a corrected signal by performing inverse Fourier transform of the second spectrum signal;
wherein the signal analysis unit includes a slit-shaped filter configured to generate the second spectrum signal by filtering the first spectrum signal, and a restoration lens set configured to generate the corrected signal by performing the inverse Fourier transform of the second spectrum signal.

12. The apparatus as claimed in claim 11, wherein the original signal is a signal that is changed according to a first variable and a second variable, and the corrected signal is a signal that is independent of the first variable.

13. The apparatus as claimed in claim 11, wherein the first and second overlay measurement keys include a grating shape having a length extending in a first direction, the first and second overlay measurement keys are arranged to be spaced apart from each other in the first direction, and an image of the corrected signal includes a first grating shape and a second grating shape that overlap each other.

14. The apparatus as claimed in claim 13, wherein the second overlay measurement key is formed at a higher level than the first overlay measurement key, and the first overlay is arranged to be shifted from the second overlay measurement key in a second direction that is different from the first direction.

15. The apparatus as claimed in claim 11, wherein the signal analysis unit includes a storage unit configured to sense and store the first spectrum signal, a first operation unit configured to generate a second spectrum signal by operating the first spectrum signal and a delta function, and a second operation unit configured to generate the corrected signal by performing the inverse Fourier transform of the second spectrum signal.

16. The apparatus as claimed in claim 11, wherein the first spectrum signal is formed in a spectrum domain that includes a first axis and a second axis, which has an optical axis of the Fourier transform lens set as an original point, the first spectrum signal includes a plurality of dot signals, and a pitch of the first spectrum signal in a second-axis direction is wider than a pitch in a first-axis direction.

17. A method of measuring an overlay, comprising:
illuminating first and second overlay measurement keys to generate an original signal based on the first and second overlay measurement keys, the first and second overlay measurement keys each including a plurality of bars having a length and a width;
generating a first spectrum signal by performing Fourier transform of the original signal, a pitch of the first spectrum signal corresponding to the widths and the lengths of the first and second overlay measurement keys;
generating a second spectrum signal by filtering the first spectrum signal; and
generating a corrected signal by performing inverse Fourier transform of the second spectrum signal, wherein a distance between the first and second overlay measurement keys along a first direction is shorter than an optical width of the light that illuminates the first and second overlay measurement keys;
wherein performing the Fourier transform of the original signal includes making the original signal pass through a Fourier transform lens set; and wherein the first spectrum signal is formed in a spectrum domain that includes a first axis and a second axis, which has an optical axis of the Fourier transform lens set as an original point, the first spectrum signal includes a plurality of dot signals, and a pitch of the first spectrum signal in a second-axis direction is wider than a pitch in a first-axis direction.

* * * * *